United States Patent [19]

Whitlock

[11] 4,389,590

[45] Jun. 21, 1983

[54] SYSTEM FOR RECORDING WAVEFORMS USING SPATIAL DISPERSION

[75] Inventor: Robert R. Whitlock, Hyattsville, Md.

[73] Assignee: The United States of America as represented by the Secretary of the Navy, Washington, D.C.

[21] Appl. No.: 296,402

[22] Filed: Aug. 26, 1981

[51] Int. Cl.³ .......................................... H01L 41/08
[52] U.S. Cl. .......................... 310/313 R; 310/313 B; 333/154; 358/201; 358/213; 330/4.6; 357/26
[58] Field of Search ............... 310/313 R, 311, 313 B, 310/313 C, 322; 346/1; 367/7; 357/26; 365/103, 114; 358/201, 213; 330/5.5, 4.6; 324/111, 113, 77 R, 77 A, 78 E, 102, 109; 333/154, 193; 250/370, 301, 395; 235/181; 343/17.1, 100 CL

[56] References Cited

U.S. PATENT DOCUMENTS

| | | | |
|---|---|---|---|
| 3,647,665 | 3/1972 | Lester | 310/311 X |
| 3,678,401 | 7/1972 | Adler | 330/5.5 |
| 3,679,985 | 7/1972 | Fang | 330/4.6 |
| 3,821,667 | 6/1974 | Thomann | 333/154 |
| 3,862,431 | 1/1975 | Quate et al. | 330/5.5 X |
| 3,871,017 | 3/1975 | Pratt, Jr. | 357/26 |
| 3,873,858 | 3/1975 | Burke et al. | 310/313 R |
| 3,909,741 | 9/1975 | Harris | 330/5.5 |
| 3,970,778 | 7/1976 | Adkins | 310/311 X |
| 4,122,495 | 10/1978 | Defranould et al. | 358/213 |
| 4,225,887 | 9/1980 | Gautier | 310/322 X |

Primary Examiner—Mark O. Budd
Attorney, Agent, or Firm—Robert F. Beers; William T. Ellis; Alan P. Klein

[57] ABSTRACT

A waveform recorder wherein surface acoustic waves excited in a piezoelectric-insulator-semiconductor layered structure produce a traveling electric field in the semiconductor substrate. Charges stored in the traveling potential wells and representing the instantaneous amplitude of a waveform to be recorded are transferred at high speed and density to different respective spatial locations. Because each successive well represents a different time instant of the waveform, the different spatial locations correspond to different times. The output signal from each of the locations can be selectively delayed before application to a display oscilloscope to enable display of the waveform at a rate many times slower than the actual frequency of the signal waveform.

12 Claims, 3 Drawing Figures

SYSTEM FOR RECORDING WAVEFORMS USING SPATIAL DISPERSION

BACKGROUND OF THE INVENTION

This invention relates to a system for recording electrical waveforms and more particularly to such a system employing a charge transfer device.

Prior art waveform recorders are bulky, expensive items which typically have bandwidths of about 1 gigahertz or less.

The fastest recorders of nonrepetitive electrical waveforms are oscilloscopes, which operate on the principle of deflecting on electron beam. A common way to achieve fast response is to compromise the sensitivity of the oscilloscope. Compensation for the loss in sensitivity can sometimes be made by employing amplification in the electronics, which is difficult and expensive for fast pulses.

Digital recorders of nonrepetitive waveforms are even more expensive and generally have less bandwidth than state-of-the-art oscilloscopes.

For repetitive signals, sampling scopes offer better temporal resolution than oscilloscopes. One reason sampling scopes are used is to obtain temporal resolution of the waveform, even if that requires the added inconvenience of sampling many repetitions of the waveform. If superior temporal resolution were available, many applications of the expensive sampling scopes would be obviated.

Present sytems for fast detecting and recording of photons are often bulky, like streak cameras, or else are typically limited to a bandwidth of 1 GHz or less. Active electronic detection systems like CCD's must have cycle times shorter than the temporal resolution desired.

Travelling surface acoustic waves (SAW) are generated by applying an RF signal to interdigitated contacts of suitable size located on a surface with piezoelectric properties. The interaction of the travelling SAW with the piezoelectric medium produces a potential wave which travels with the acoustic wave. By arranging a semiconductor to be in close proximity to the piezoelectric medium, the potential wave can be made to extend into the semiconductor, resulting in travelling potential wells in the semiconductor. Charge carriers can be injected into these wells by a source of carriers such as a signal generator, and the carriers are then transported in the wells by the SAW. The presence of a biased, conducting field plate over the charge transfer region is used to deplete the semiconductor in that region. Minority charge carriers which are injected into the SAW and beneath the field plate are transported in the travelling wells at the velocity of the SAW. The majority carriers are repulsed by the field plate. The minority charge carriers are retained beneath the field plate, rather than conducting away in a direction perpendicular to the propagation vector of the SAW, owing to the attractive potential established by the field plate. (The field plate thus behaves much like an MOS gate in a CCD.) The carriers in neighboring travelling wells do not mingle, so long as the wells are not overfilled. The conventional method of collecting the charges involves collecting the charge with a detector which is placed directly in the path of the SAW. The disadvantage of this approach is that an injected 10 GHz signal must be read and recorded with 10 GHz electronics. Travelling SAWs have been used to transfer electronic charges along or near the surface of piezoelectric materials, the resulting devices being referred to as charge transfer devices (CTD's). Such devices have been disclosed in the article "A Monolithic SAW-Charge Transfer Device" by N. A. Papanicolaou and H. C. Lin in *Remote Sensing of Earth from Space: Role of "Smart Sensors"*, edited by Roger A. Breckenridge, Vol. 67 of Progress in Astronautics and Aeronautics, pp. 325-351 (1979); in the Ph.D. dissertation entitled "A Monolithic Surface Acoustic Wave Charge Transfer Device" by Nicolas A. Papanicolau, for the Electrical Engineering Dept., University of Maryland, 1979; and in the pending U.S. Patent application of the same title, all whose disclosures are herein incorporated by reference.

SUMMARY OF THE INVENTION

Accordingly, it is an object of the present invention to record electrical waveforms.

Another object is to record electrical waveforms using a charge transfer device.

These and other objects of the present invention are achieved by a waveform recorder which includes a semiconductor body; an planar piezoelectrical body having a main surface overlying and in proximity to the semiconductor body; and wave propagation means for propagating acoustic wave signals on the main surface of the piezoelectric body to create traveling wells in the underlying semiconductor body. The waveform recorder further includes charge injection means for injecting into the potential wells traveling past at least one first location in the semiconductor body a quantity of minority charge carriers whose magnitude tracks with time the waveform of a signal to be recorded; charge collection means for collecting the injected charge carriers at a plurality of spatially separated second locations in the semiconductor body; and semiconductor depletion means for depleting the semiconductor body in a region between the first and second locations to provide a channel for the transport of the minority charge carriers by the traveling potential wells. Charge dispersion means are provided for causing charge carriers injected into the potential wells at each of a plurality of instants of time to be transported to a respective one of the second locations. The pattern of charge collected at the plurality of spatially separated second locations represents the waveform of the signal to be recorded.

The advantages of this invention include its small size and economy of cost. The system is capable of fast serial input and slow parallel output without loss of temporal resolution. It provides superior temporal resolution because of its greater than 1 GHz bandwidth. No electron beam is used for recording. Signals produced by detection of particles or waves can be recorded. The system is capable of digital output and continuous recording. Even a single, nonrepetitive waveform can be recorded.

Additional advantages and features will become apparent as the subject invention becomes better understood by reference to the following detailed description when considered in connection with the accompanying drawings, herein:

DESCRIPTION OF THE PREFERRED EMBODIMENTS

Figure 1:
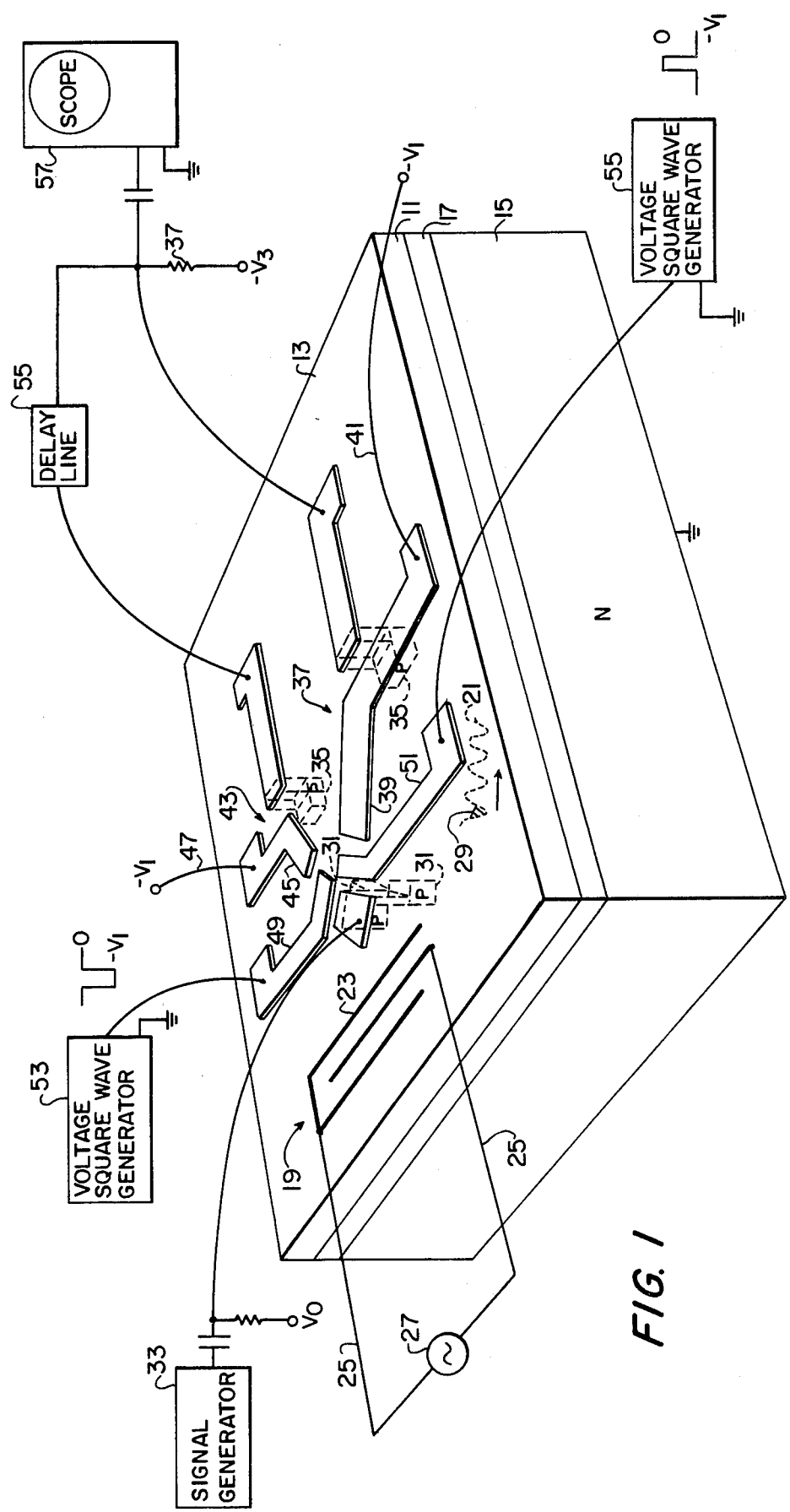
FIG. 1 is a first embodiment of the waveform recorder according to the present invention.

Referring to FIG. 1, a waveform recorder embodying the invention includes a planar piezoelectric body 11, typically of ZnO, having a surface 13 overlying and in proximity to a semiconductor body 15, typically of n-type silicon. The two bodies may be separated, for example, by an insulating layer 17, such as $SiO_2$. Wave propagation means 19 propagates acoustic wave signals on the main surface 13 of the piezoelectric body 11. The acoustic wave signals are understood to create in the underlying semiconductor body 15 travelling potential wells 21 which are capable of conveying charge from one location to another through a depleted region of the semiconductor. While the wave propagation means 19 may take a variety of forms, conveniently it may take the form illustrated in FIG. 1 of an electromechanical transducer 23 of the interdigital comb type formed on the main surface 13 of the piezoelectric body 11, and connected by way of leads 25 to an alternating current source 27.

Charge injection means injects into the potential wells 21 traveling past at least one first location in the semiconductor body 15 a quantity of minority charge carriers 29 whose magnitude tracks with time the waveform of a signal to be recorded; and charge collection means collects the injected charge at a plurality of spatially separated second locations in the semiconductor body. The charge injection means may compromise, for example, at least one p-n junction 31 disposed at the first location (two commonly-connected junctions are shown in FIG. 1) in which current flow proportional to the instantaneous amplitude of the signal to be recorded is produced by a forward bias $V_o$ and the generator 33 of the signal to be recorded. The charge collection means may comprise, for example, a plurality of p-n junctions 35 disposed at the spatially separated second locations. The output signals from the p-n junctions 35 appear at the load resistor 37 and are produced by the reverse bias $-V_3$ and the current flow in the p-n junctions 35 arising from collection of the charge carriers 29 from the potential wells 21.

Semiconductor depletion means 37 depletes the semiconductor body 15 in a region between the first and second locations to provide a first channel for the transport of the minority charge carriers 29 by the potential wells 21. The semiconductor depletion means 37 may comprise, for example, a metal electrode 39 which is formed on the main surface 13 of the piezoelectric body 11 and has one part overlying a first charge-collecting p-n junction 35. The metal electrode 39 is connected by way of lead 41 to an external potential source to bias it at a voltage $-V_1$ with respect to the semiconductor body 11. Biasing the metal electrode 39 at the voltage $-V_1$ repels majority carriers from the region of the semiconductor body 15 immediately below the metal electrode and attracts minority carriers to the region vacated by the majority carriers, so that a minority charge transport channel is formed directly beneath the metal electrode.

Charge dispersion means causes charge carriers injected at each of a plurality of instants of time at the first location into the traveling potential wells 21 to be transported to a respective one of the the second locations. While the charge dispersion means may take a variety of forms, conveniently it may take the form shown in FIG. 1 of a second semiconductor depletion means 43 which depletes the semiconductor body 15 in another region between the first and second locations to provide a second channel for the transport of the minority charge carriers by the traveling potential wells; and means which alternately extends the first and second channels to the first location to gate the injected charge carriers into one or the other channel. The second semiconductor depletion means 43 may comprise, for example, another metal electrode 45 formed on the main surface 13 of the piezoelectric body 11, and having one part overlying a second charge-collecting p-n junction 35. The metal electrode 45 is connected by way of lead 47 to an external potential source to bias it at the voltage $-V_1$ with respect to the semiconductor body 15. The means for extending the first and second channels to the first location may comprise, for example, third and fourth metal electrodes 49 and 51 formed on the main surface 13 of the piezoelectric body 11, each respectively disposed between another part of one of the metal electrodes 39 and 45 and the area of the main surface of the piezoelectric body which overlies the first location; and means which alternately biases one and then the other of the metal electrodes 49 and 51 at the voltage $-V_1$ with respect to the semiconductor body 11. The metal electrodes 39 and 51 must be in sufficiently close proximity to each other that their fringing fields overlap. Likewise, the metal electrodes 49 and 45 must be in sufficiently close proximity to each other that their fringing fields overlap. The alternating bias means gates the minority charge carriers into one or the other of the two channels. While the alternating bias means may take a variety of forms, conveniently it may take the form illustrated in FIG. 1 of a pair of generators 53 and 55 of complementary voltage square waves, each connected to a respective one of the metal electrodes 49 and 51.

The pattern of charge collected at the spatially separated second locations as a result of the action of the charge dispersion means represents the waveform of the signal to be recorded. That is to say, the charge collected at each one of the second locations, or the corresponding voltage across load resistor 37, represents the amplitude of the signal at a respective instant of time. If the different quantities of charge, or the voltages, are plotted against time, the waveform is recovered. To maintain the clarity of the drawings, only two charge-collecting p-n junctions 35 are illustrated; however, it will be understood that as many second locations can be employed as are required for a desired degree of resolution of the waveform —25 to 50 second locations being a more typical number. The voltage output signal from each of the second locations can be delayed by respective progressively larger increments, as, for example, in a delay line 55, before application to the Y axis of a display oscilloscope 57 to enable display of the waveform at a rate many times slower than the actual frequency of the original signal which it is desired to record.

Figure 2:
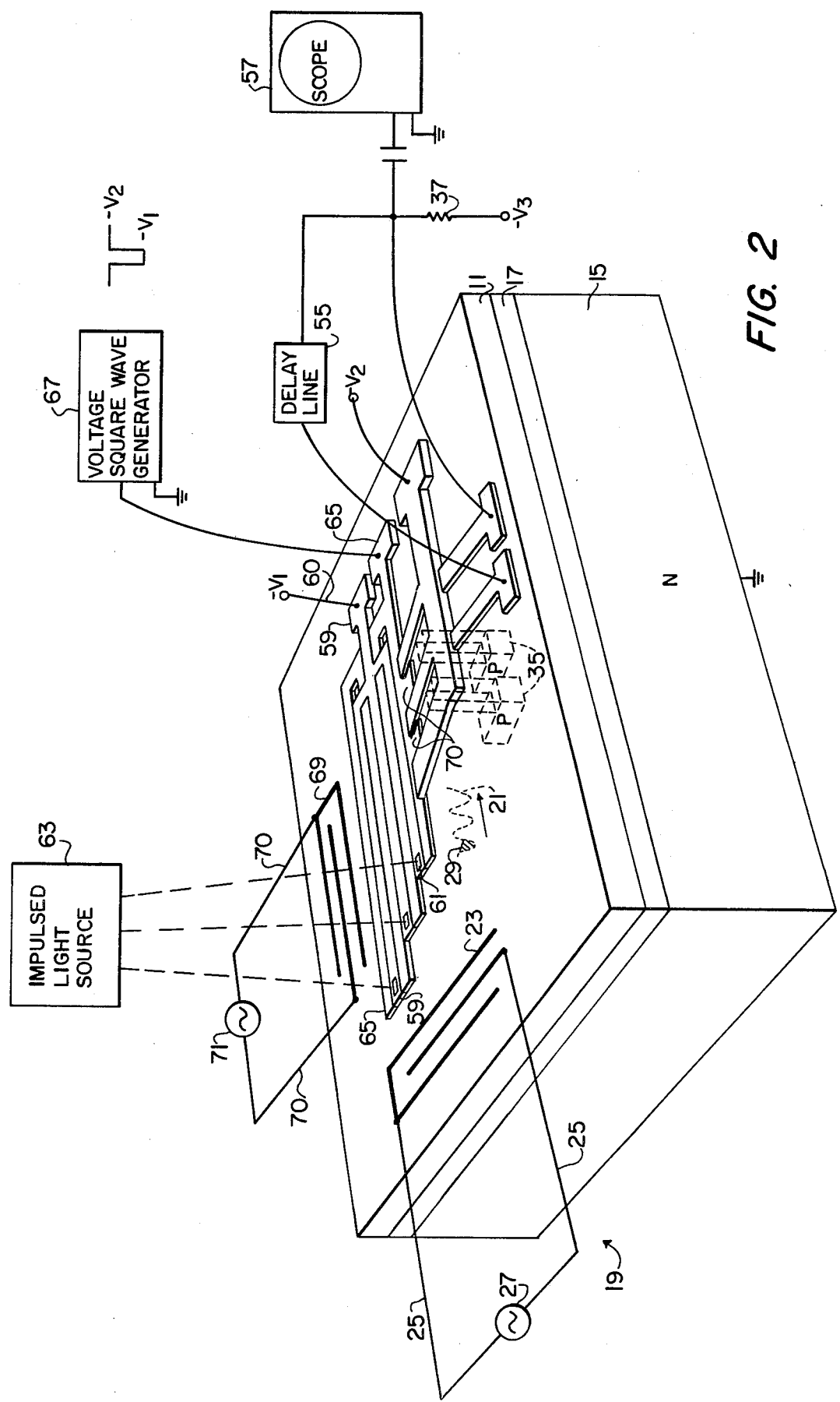
FIG. 2 is a second embodiment of the waveform recorder according the the present invention.

A second embodiment of the waveform recorder is shown in FIG. 2. This embodiment is the same as the device of FIG. 1 except for the details of the charge injection means, the first semiconductor depletion means, and the charge dispersion means. Specifically, the first semiconductor depletion means comprises a metal electrode 59 which is formed on the main surface 13 of the piezoelectric body 11 with one part overlying the first location and which is connected by way of lead 60 to an external potential source to bias it at the voltage $-V_1$ with respect to the semiconductor body 15. The charge injection means is an opening 61 in the metal electrode 59 and over the first location. Current flow proportional to the instantaneous amplitude of the signal to be recorded is produced by photons from an impulsed light source 63 striking the semiconductor body through the opening 61. The charge dispersion means comprises a second semiconductor depletion means which depletes the semiconductor body in another region between the first and second locations to cause the first channel to put forth branches to each of the second locations; means which intermittently operates the second semiconductor means; and second wave propagation means which propagates acoustic wave signals on the main surface of the piezoelectric body in a direction transverse to that of the first wave propagation means to superpose another set of traveling potential wells with the potential wells created in the underlying semiconductor body by the acoustic wave signals from the first wave propagation means to form resultant potential wells traveling into the branches leading to each of the second locations. While the second depletion means, the intermittent operating means, and the second wave propagation means may take a variety of forms, conveniently they may respectively take the form shown in FIG. 2 of a second metal electrode 65 formed on the main surface of the piezoelectric body 11, a voltage square wave generator 67 connected to the metal electrode 65, and another electromechanical transducer 69 connected by way of leads 70 to an alternating current source 71. The metal electrode 65 is contiguous with, but insulated from, the metal electrode 59 and it has a plurality of branches 70 which overlie respective second locations. The square wave generator intermittently biases the metal electrode 65 at the voltage $-V_1$ with respect to the semiconductor body (and at a voltage $-V_2$ otherwise, where $V_2$ is a voltage between 0 and the threshold voltage for the onset of depletion) thereby depleting the semiconductor beneath the metal electrode 65 and its branches. When the metal electrode 65 is biased at the voltage $-V_1$ the charge carriers in the potential wells traveling in the first channel are transferred by the resultant potential wells traveling into the branches to the second locations which are located at unequal distances (and travel times) from the first location. The collection of the charge carriers at the second locations and display of the signal waveform are accomplished in the same manner as in the device of FIG. 1.

Figure 3:
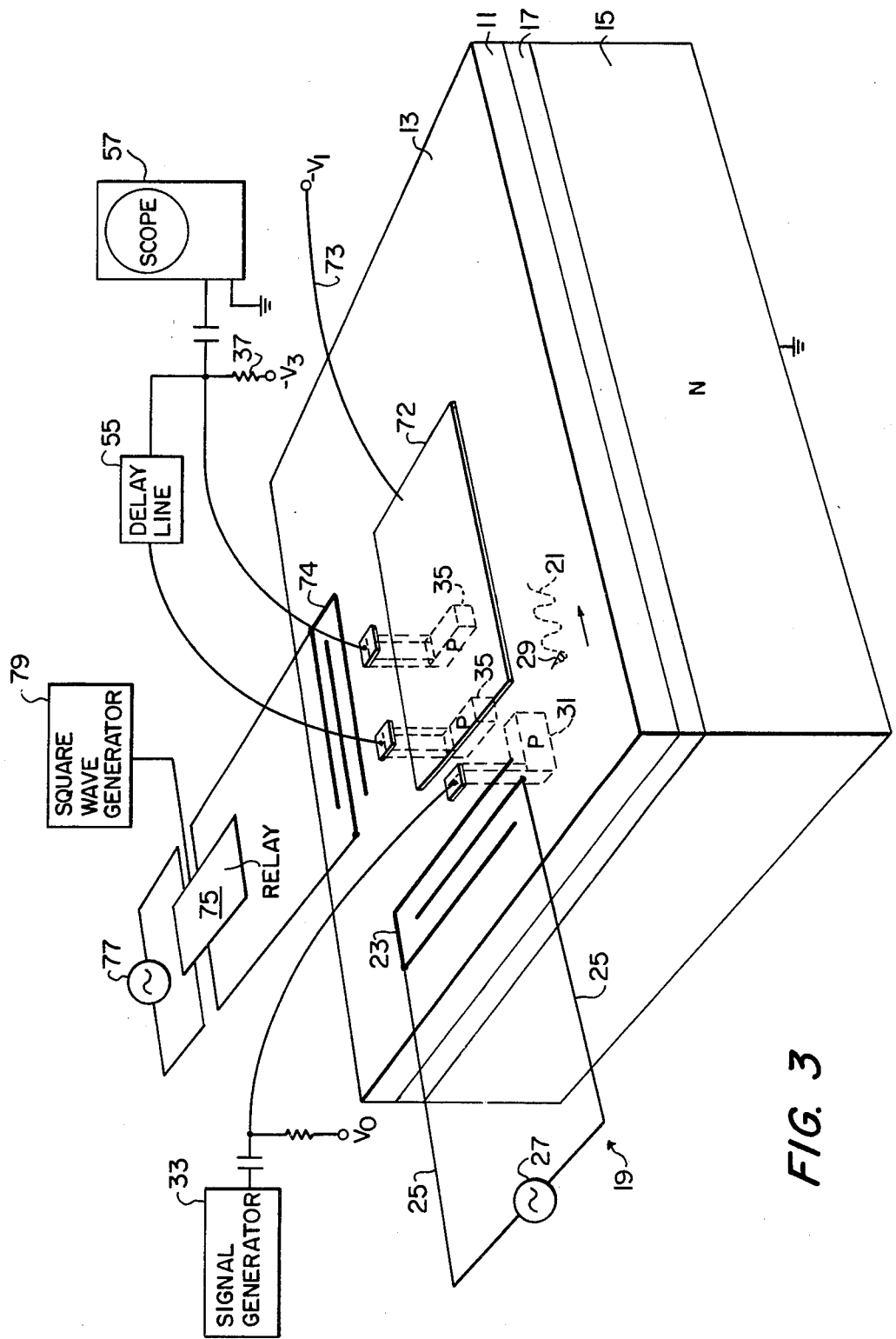
FIG. 3 is a third embodiment of the waveform recorder according to the present invention.

A third embodiment of the waveform recorder is shown in FIG. 3. This embodiment is the same as the device of FIG. 1 except for the details of the first semiconductor depletion means and the charge dispersion means. Specifically, the first semiconductor depletion means comprises a metal electrode 72 which is formed on the main surface 13 of the piezoelectric body 11 with one part overlying the first location and another part overlying the plurality of second locations, and which is connected by way of lead 73 to an external potential source to bias it at the voltage $-V_1$ with respect to the semiconductor body 15 to deplete the semiconductor beneath the metal electrode. The charge dispersion means comprises a second wave propagation means which propagates acoustic wave signals on the main surface 13 of the piezoelectric body 11 in a direction transverse to that of the first wave propagation means to superpose another set of traveling wells with the potential wells created in the underlying semiconductor body 15 by the acoustic signals from the first wave propagation means to form resultant potential wells traveling away from the plurality of second locations; and means which intermittently operates the second wave propagation means. While the second wave propagation means and the intermittent operating means may take a variety of forms, conveniently they may respectively take the form shown in FIG. 3 of another electromechanical transducer 74 connected by a relay 75 to an alternating current source 77; and a voltage square wave generator 79 connected to the relay to intermittently close and open the relay for activating and inactivating the transducer. Initially the second transducer 74 is activated and the charge carriers are deflected by the resultant potential wells away from the second locations. When the second transducer 74 is inactivated, there remain only the potential wells created by the acoustic wave signals from the first wave propagation means. These wells immediately empty their charge carriers into respective adjacent second locations which lie at unequal distances (and travel times) from the first location. The display of the signal waveform is accomplished in the same manner as in the device of FIG. 1.

Therefore, it is apparent that the disclosed system is a highly efficient means for recording electrical waveforms. The temporal resolution of the recorder is dependent on the SAW wavelength—with 1 micron interdigital combs on the electromechanical transducer a 1 GHz bandwidth and roughly 1 nsec. resolution can be obtained; with submicron lithography, greater than 10 GHz bandwidth should be feasible. Photon detectors of such speeds are available for use as charge injection means. At these speeds, silicon surface traps which are such an impediment for slower (less than 2 MHz) silicon devices, would not have sufficient time to interact with the traveling wells. A SAW spatial dispersion waveform recorder may be capable of greater time resolution than conventional electronic recorders because SAWs are not subject to the constraints of capacitance.

The dynamic range of the recorder may be in excess of $10^4$, on the basis of calculations reported by other workers for SAW-CTDs, which imply $10^5$ electrons may be carried per well.

Monolithic or composite materials can be used to fabricate the recorder. If needed, on-chip amplifiers can be added to the read-out function.

Obviously, numerous modifications and variations of the present invention are possible in light of the above teachings. For example, instead of directly reading out the charge at the plurality of second locations, static wells (e.g. MOS capacitors) can be employed to capture the charge, hold it and release it upon demand. The charge carriers in each well can be read and counted, using techniques of the prior art, which would transform the waveform recorder into a transient digitizer. Also, the method taught herein can be applied to produce a continuously operating recorder. A plurality of charge transport channels extending in different directions from the same carrier injector can be alternately employed. While one charge transport channel is transporting carriers away from the charge injection means, carriers already in another charge transport channel (having been transported from the same charge injection means at an earlier time) can be spatially dispersed, captured in static wells or be read out. In this way, there is always one charge transport channel into which the carriers are being transferred, so the recorder operates continuously. The exact size of the various features of the recorder depend on the temporal resolution desired, the SAW velocity, the read-out cycle time and similar factors.

It is therefore to be understood that, within the scope of the appended claims, the invention may be practiced otherwise than as specifically discribed herein.

What is claimed as new and desired to be secured by Letters Patent of the United States is:

1. A waveform recorder comprising:
   a semiconductor body;
   a planar piezoelectric body having a main surface overlying and in proximity to the semiconductor body;
   first wave propagation means for propagating acoustic wave signals on the main surface of the piezoelectric body to create traveling potential wells in the underlying semiconductor body;
   charge injection means for injecting into the potential wells traveling past at least one first location in the semiconductor body a quantity of minority charge carriers whose magnitude tracks with time the waveform of a signal to be recorded;
   charge collection means for collecting the injected charge carriers at a plurality of spatially separated second locations in the semiconductor body;
   first semiconductor depletion means for depleting the semiconductor body in one region between the first and second locations to provide a first channel for the transport of the minority charge carriers by the traveling potential wells; and
   charge dispersion means for causing charge carriers injected into the potential wells at each of a plurality of instants of time to be transported to a respective one of the second locations,
   whereby the pattern of charge collected at the plurality of spatially separated second locations represents the waveform of the signal to be recorded.

2. The waveform recorder recited in claim 1 wherein the first semiconductor depletion means includes:
   a first metal electrode formed on the main surface of the piezoelectric body and having one part overlying a second location; and
   means for biasing the first metal electrode with respect to the semiconductor body to repel majority carriers from the region of the semiconductor body immediately below the first metal electrode and to attract minority carriers to the region vacated by the majority carriers.

3. The waveform recorder recited in claim 2 wherein the charge dispersion means includes:
   second semiconductor depletion means for depleting the semiconductor body in another region between the first and second locations to provide a second channel for the transport of the minority charge carriers by the traveling potential wells; and
   means for alternately extending the first and second channels to the first location to gate the charge carriers into the first or the second channel.

4. The waveform recorder recited in claim 3 wherein the second semiconductor depletion means includes:
   a second metal electrode formed on the main surface of the piezoelectric body and having one part overlying a second location; and
   means for biasing the second metal electrode with respect to the semiconductor body to repel majority carriers from the region of the semiconductor body immediately below the metal electrode and to attract minority carriers to the region vacated by the majority carriers.

5. The waveform recorder recited in claim 4 wherein the extending means includes:
   third and fourth metal electrodes formed on the main surface of the piezoelectric body, each respectively disposed between another part of one of the first and second electrodes and an area of the main surface of the piezoelectric body overlying the first locations; and
   means for alternately biasing one and then the other of the third and fourth electrodes with respect to the semiconductor body to repel majority carriers from the region of the semiconductor body immediately below the respective metal electrode and to attract minority carriers to the region vacated by the majority carriers.

6. The waveform recorder recited in claim 1 wherein the first semiconductor depletion means includes:
   a first metal electrode formed on the main surface of the piezoelectric body and having one part overlying a first location; and
   means for biasing the first metal electrode with respect to the semiconductor body to repel majority carriers from the region of the semiconductor body immediately below the first metal electrode and to attract minority carriers to the region vacated by the majority carriers.

7. The waveform recorder recited in claim 6 wherein the charge dispersion means includes:
   second semiconductor depletion means for depleting the semiconductor body in another region between the first and second locations to cause the first charge transport channel to put forth branches to each of the second locations;
   means for intermittently operating the second semiconductor depletion means; and
   second wave propagation means for propagating acoustic wave signals on the main surface of the piezoelectric body in a direction transverse to that of the first wave propagation means to superpose another set of traveling potential wells with the potential wells created in the underlying semiconductor body by the acoustic wave signals from the first wave propagation means to form resultant wells traveling into the branches leading to each of the second locations.

8. The waveform recited in claim 7 wherein the second semiconductor depletion means includes:
   a second metal electrode formed on the main surface of the piezoelectric body and contiguous with, but insulated from, the first metal electrode and having a plurality of branches overlying respective second locations.

9. The waveform recorder recited in claim 8 wherein the intermittent operating means includes:
   a voltage square wave generator connected to the second metal electrode for intermittently biasing the second metal electrode with respect to the semiconductor body to repel majority carriers from the region of the semiconductor body immediately below the metal electrode and to attract minority carriers to the region vacated by the majority carriers.

10. The waveform recorder recited in claim 1 wherein the first semiconductor depletion means includes:

a metal electrode formed on the main surface of the piezoelectric body and having one part overlying the first location and another part overlying the plurality of second locations; and means for biasing the metal electrode with respect to the semiconductor body to repel majority carriers from the region of the semiconductor body immediately below the metal electrode and to attract minority carriers to the region vacated by the majority carriers.

11. The waveform recorder recited in claim 10 wherein the charge dispersion means includes:

second wave propagation means for propagating acoustic wave signals on the main surface of the piezoelectric body in a direction transverse to that of the first wave propagation means to superpose another set of traveling potential wells with the potential wells created in the underlying semiconductor body by the acoustic signals from the first wave propagation means to form resultant potential wells traveling away from the plurality of second locations;

and means for intermittently operating the second wave propagation means.

12. A method of recording waveforms comprising the steps of:

propagating acoustic wave signals on the main surface of a piezoelectric body to create traveling potential wells in an underlying semiconductor body;

injecting into the potential wells traveling past at least one first location in the semiconductor body a quantity of minority charge carriers whose magnitude tracks with time the waveform of a signal to be recorded;

depleting the semiconductor body in one region between the first and a plurality of spatially separated second locations to provide a channel for the transport of the minority charge carriers by the traveling potential wells;

causing charge carriers injected into the potential wells at each of a plurality of instants of time to be transported to a respective one of the second locations; and collecting the injected charge carriers at the plurality of second locations;

whereby the pattern of charge collected at the plurality of spatially separated second locations represents the waveform of the signal to be recorded.

* * * * *